United States Patent
Blish et al.

(10) Patent No.: US 6,483,337 B1
(45) Date of Patent: Nov. 19, 2002

(54) METHOD FOR ACHIEVING SYNCHRONOUS NON-DESTRUCTIVE LATCHUP CHARACTERIZATION

(75) Inventors: Richard C. Blish, Saratoga, CA (US); Scott E. Johnson, Aptos, CA (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 3 days.

(21) Appl. No.: 09/625,393

(22) Filed: Jul. 26, 2000

(51) Int. Cl.[7] .............................................. G01R 31/26
(52) U.S. Cl. ..................... 324/765; 324/158.1; 324/763; 714/733
(58) Field of Search ................... 324/754, 760, 324/763, 765, 766, 767, 768, 769, 158.1; 361/56; 257/376; 371/22.1, 22.5; 714/724, 727, 731, 733, 738

(56) References Cited

U.S. PATENT DOCUMENTS

| | | | | | |
|---|---|---|---|---|---|
| 3,768,011 A | * | 10/1973 | Swain | ..................... | 324/117 R |
| 4,797,724 A | * | 1/1989 | Bolder | ........................ | 257/376 |
| 4,939,616 A | * | 7/1990 | Rountree | ..................... | 361/56 |
| 5,225,702 A | * | 7/1993 | Chatterjee | ................... | 438/135 |
| 5,528,188 A | * | 6/1996 | Au | .............................. | 327/310 |

* cited by examiner

Primary Examiner—Michael Sherry
Assistant Examiner—Trung Nguyen

(57) ABSTRACT

A semiconductor structure is tested for latchup characteristics by imposing increasing levels of current thereon, and measuring increase in structure current in response thereto. When an imposition in current results in a corresponding increase in semiconductor structure current which is not substantially linearly proportional to the amount of current imposed thereon, onset of latchup is indicated. Other semiconductor structures are tested, and measurements are compared to gain knowledge of the structures tested.

3 Claims, 3 Drawing Sheets

METHOD FOR ACHIEVING SYNCHRONOUS NON-DESTRUCTIVE LATCHUP CHARACTERIZATION

BACKGROUND OF THE INVENTION

1. Field of the Invention

This invention relates generally to semiconductor structures, and more particularly, to a method for characterizing latchup parameters of semiconductor structures.

2. Discussion of the Related Art

In bulk CMOS structure, a phenomenon known is latchup can occur, which will now be described with reference to FIGS. 1 and 2. As shown in FIG. 1, a typical bulk CMOS structure includes a P substrate having an N well formed therein. The P substrate forms part of an NPN MOS transistor 12, while the N well forms part of a complementary PNP MOS transistor 10, all as is well-known. The P region of the MOS transistor 10, N well, P substrate and P region in P substrate form a PNP parasitic bipolar transistor Q1, we the N well, N region in N well, P substrate and N region of the MOS transistor 12 form an NPN parasitic bipolar transistor Q2. The equivalent circuit including the two parasitic bipolar transistors Q1, Q2, substrate resistance Rsub and N well resistance R well are shown in FIG. 2.

Latchup can occur when Vout drops below Ground due to, for example, a noise spike. With Vout connected to the base of the parasitic bipolar NPN transistor Q2, sufficient current may flow through Rsub to turn on parasitic bipolar transistor Q2. This will draw current through R well, which will turn on transistor Q1, so that a self sustaining low resistance path between power rails is formed. If the gains of the transistors Q1 and Q2 are such that β1 of transistor Q1 times β2 of transistor Q2 is greater than 1, latchup can occur. Once latchup has begun, the only way to stop it is to reduce the current below a critical level, usually by removing power from the circuit.

Typically, latchup characterization of a product consists of an initialization process which uses appropriate test vectors to tristate all outputs and put the devices in a known, stable state at maximum power supply voltage. Then, a constant current is superimposed to a single input (a "trigger") for, for example 1 millisecond The power supply current is measured a few milliseconds later, to see if a high current state is retained after the trigger is removed, which would indicate device latchup. Typically, each input is triggered in incremental fashion up to the pass/fail limit, for example 100 milliamps. Clearly this methodology is very slow for a high leadcount package and throughput depends strongly upon the number of steps to reach the pass/fail trigger current. But in reality a latchup event is likely to preclude any further testing of any additional inputs, and is likely to preclude pushing the existing input further.

Therefore, what is needed is a method for achieving a test which yield data about the latchup characteristics of devices, which test can be performed quickly and which is non-destructive to the devices.

SUMMARY OF THE INVENTION

In the present invention, a semiconductor structure is tested for latchup characteristics by imposing currents of increasing levels on the semiconductor structure. The current change in the structure is measured upon imposition of each such level of current, and it is noted when any imposition in current on the semiconductor structure results in a corresponding current change in the structure which is not substantially linearly proportional to the amount of current imposed thereon, thereby gaining knowledge of the latchup characteristics of the structure. Other structures are tested in the same manner, and the measurements taken with regard to these structures are compared to gain knowledge of the latchup characteristics of the structures.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 1:
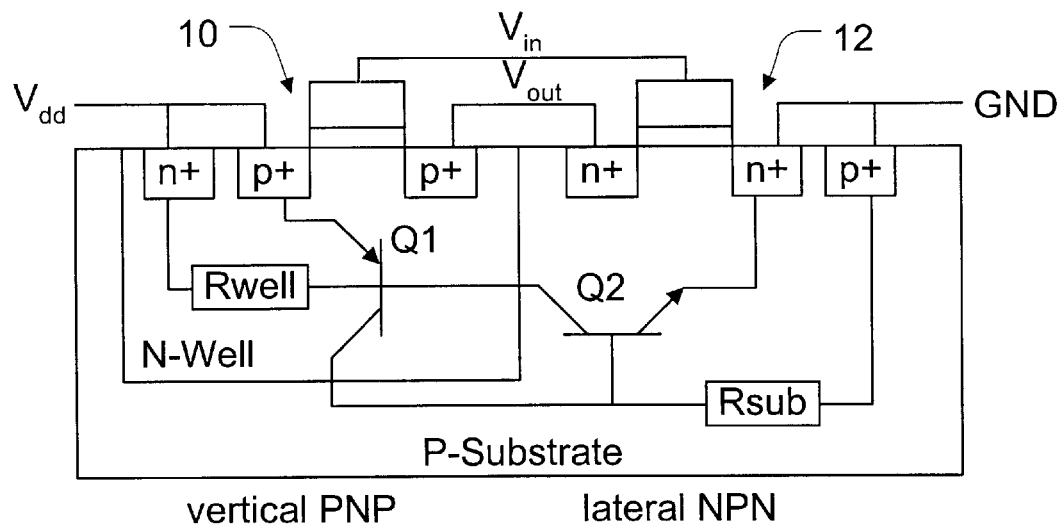
FIG. 1 is a cross-sectional view of a prior art bulk CMOS structure, showing the parasitic bipolar transistors therein.
Figure 2:
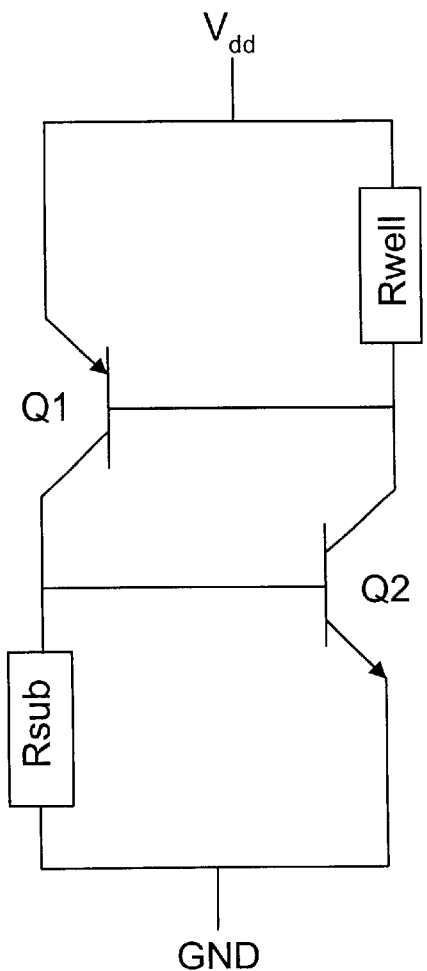
FIG. 2 is a schematic view of a circuit equivalent to FIG. 1.
Figure 3:
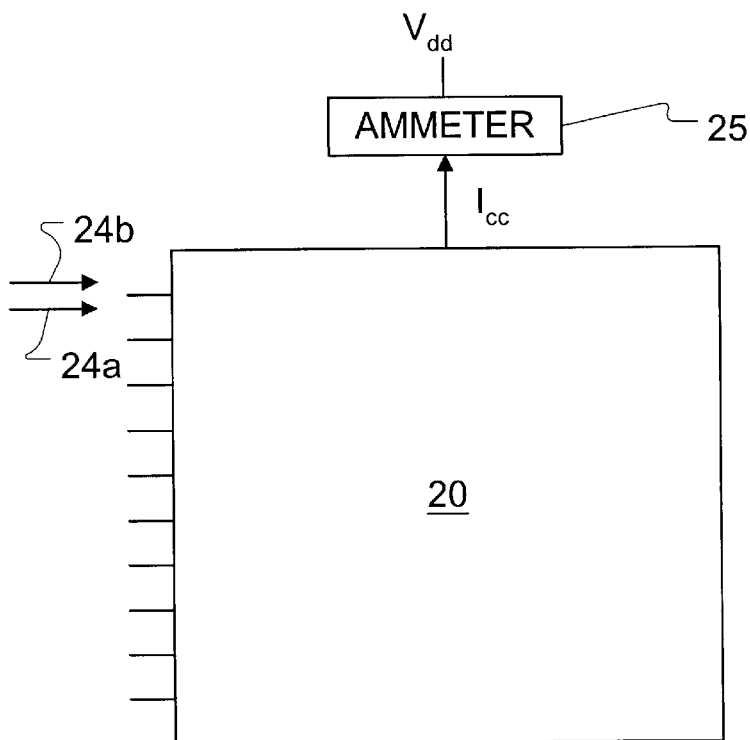
FIG. 3 is a view of a semiconductor product including semiconductor structures on which latchup characterization is undertaken.
Figure 4:
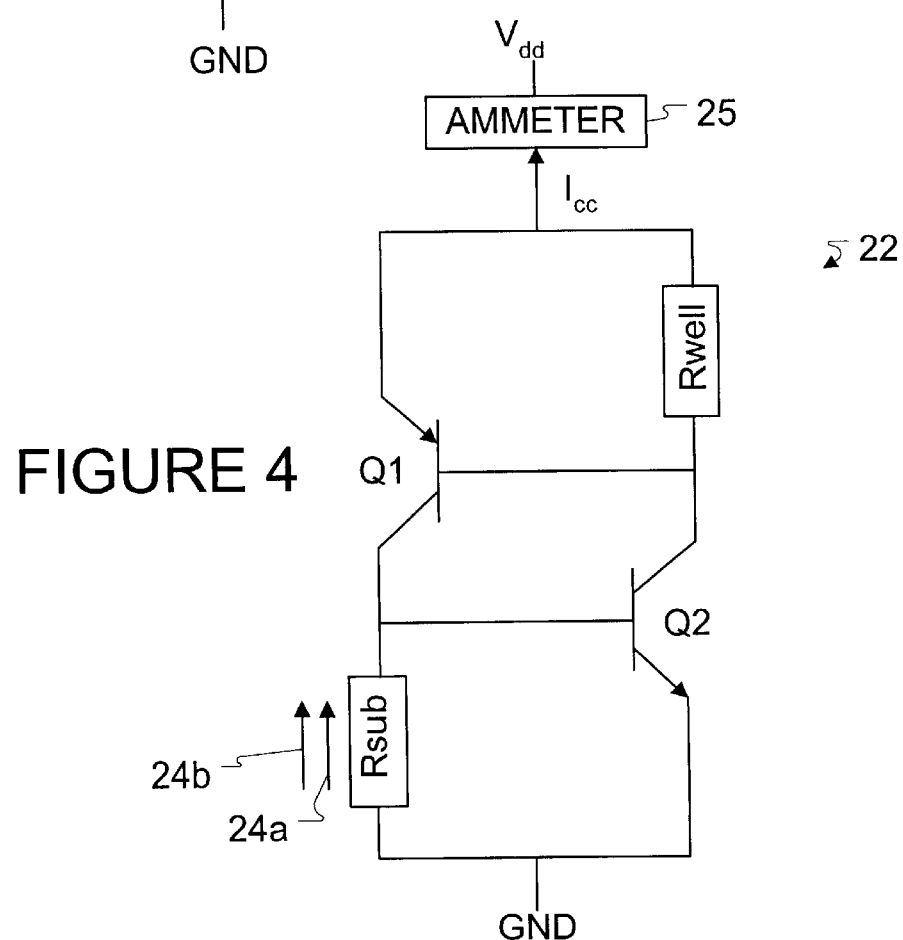
FIG. 4 is a schematic view similar to that shown in FIG. 2, showing a semiconductor structure undergoing testing for latchup characterization.

FIG. 3 shows a semiconductor product 20 which includes a plurality of semiconductor structures 22 (FIG. 4), which may take the configuration shown in FIGS. 1 and 2. FIG. 4, which is similar to FIG. 2, will be used to illustrate the present test process, which is undertaken on the structures 22 of the semiconductor product 20 of FIG. 3 in a sequential manner.

Figure 5:
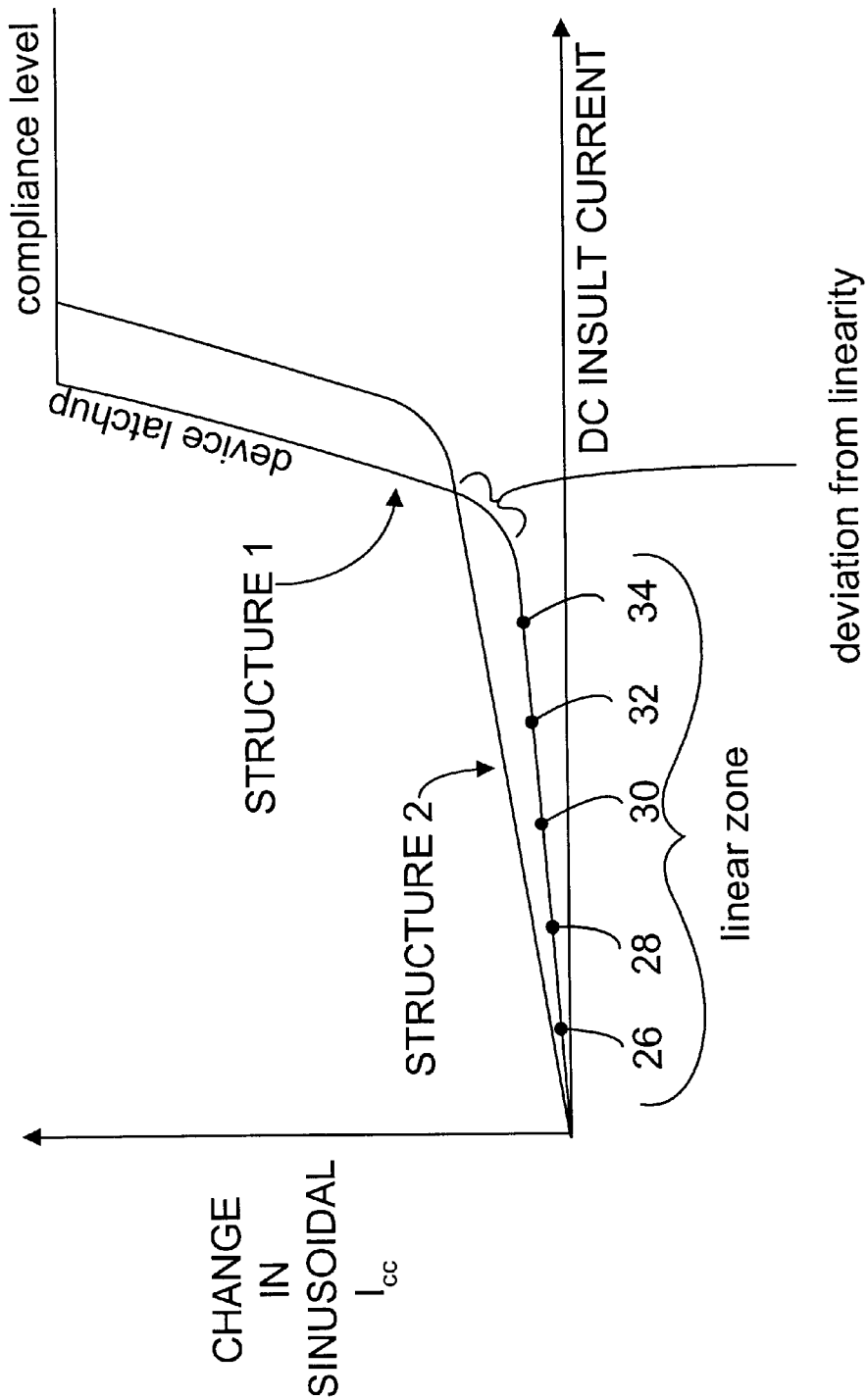
FIG. 5 is a graph showing latchup characteristics of semiconductor structures tested in accordance with the present invention.

In testing the structure 22 of FIG. 4, after an initialization process as described above is applied to all the structures of the semiconductor product 20, a relatively low dc trigger current 24a, for example, 20 milliamps, is modulated with a small signal 24b at 100 kHz and applied across the substrate of the structure 22 at a frequency of 100 kHz. With a portion of the trigger current being driven sinusoidally (for example for 100 cycles at 100 kHz for 1 millisecond duration), the sinusoidal variation in Icc at 100 kHz measured by the ac ammeter 25 would establish a data point 26 as shown in FIG. 5. The initial trigger current 24a is then removed, and with the structure 22 not in a latchup state, the change in current Icc previously measured by the ammeter 25 drops to the baseline. These steps are repeated with different, incrementally increasing levels of trigger current 24a being applied and removed to establish a number of data points 28, 30, 32, 34. As the level of trigger current 24a is incrementally increased, prior to the onset of latchup, the data points 26–34 establish a "linear zone", so-called because it is expected that each increased imposition of dc trigger current 24a results in a corresponding current change measured by the ammeter 25 which is substantially linearly proportional to the amount of trigger current 24a imposed on the semiconductor structure 22. In the linear zone, the ac portion 24b of Icc is in phase (sine) with the trigger current 24a, while the ac portion 24b of Icc would be 90 degrees out of phase (cosine) with the trigger current 24a as latchup begins to occur.

In the present process, instead of ending the testing of the device 22 at an arbitrary pass/fail trigger current level of for example 100 milliamps, the testing steps are repeated with further incrementally increasing levels of trigger current 24a, i.e., different levels of trigger current 24a, being applied and removed, to establish further data points, until the cosine Icc variation increases substantially, that is, the level of sinusoidal current change Icc measured by the ac ammeter 25 is no longer linearly proportional to the amount of trigger current 24a imposed on the structure 22, but in fact increases substantially more than that in a linear progression, indicating the onset of latchup, using the lock-in amplifier technique described.

Further upward incrementing of the trigger current 24a in the manner described above brings the semiconductor structure 22 into full latchup. However, one would detect the level of trigger current at which latchup onset is indicated, by detecting a small deviation from linearity (FIG. 5). This first, small deviation from linearity is a valuable indicator of semiconductor structure latchup robustness. Instead of relying on a coarse estimate of the latchup robustness of the structure 22, i.e., in contrast to using the traditional consecutive step stress method, a threshold figure would be defined by undertaking the tests described above. Detection of the latchup onset zone of a structure 22 enables one to avoid full latchup and irreversible damage to the structure.

As an alternative, rather than applying incrementally increasing levels of trigger current 24a, a continuously applied current, increasing in level, can be applied to establish data points as described above. In this situation, even fewer test steps are needed to provide test results.

The plot of FIG. 5 shows the relationship between change in Icc and trigger current for a given structure (STRUCTURE 1). The same testing is of course undertaken on other structures of the semiconductor product, resulting in various other plots of data. It will be understood that these plots can vary somewhat from structure to structure. For example, a second tested semiconductor structure (STRUCTURE 2, FIG. 5) may determine a linear zone which is somewhat steeper than the linear zone of the first-tested structure, but with onset of latchup occurring at a higher level of trigger current. Data may be plotted with regard to a number of structures and studied statistically. If extreme examples are indicated, these structures can be scrutinized to reveal possible problems or opportunities in structure design and/or fabrication.

It will be seen that a method is provided for characterizing the latchup parameters of semiconductor structures. The testing is rapid and non-destructive and enables one to characterize the latchup robustness of a semiconductor structure. The testing also provides data for use in comparing the robustness of structures so tested. Using such data, one may study structures which vary in characterization in a statistically significant manner, and compare them to the norm, so that optimization of structure and fabrication can be achieved.

The foregoing description of the embodiment of the invention has been presented for purposes of illustration and description. It is not intended to be exhaustive or to limit the invention to the precise form disclosed. Other modifications or variations are possible in light of the above teachings. The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of testing a semiconductor structure for latchup characteristics comprising:

imposing currents of increasing levels on a semiconductor structure;

measuring current changes in the semiconductor structure due to the imposition of such increasing levels of current;

noting when an imposition of a level of current on the semiconductor structure results in a corresponding current change in the structure which is not substantially linearly proportional to the level of current imposed thereon;

halting the imposition of current of increasing levels on the semiconductor structure when a corresponding current change in the semiconductor structure which is not substantially linearly proportional to the level of current imposed thereon is noted;

imposing increasing levels of current on a second semiconductor structure;

measuring current change in the second semiconductor structure due to the imposition of such increasing levels of current thereon;

noting when an imposition of a level of current on the second semiconductor structure results in a corresponding current changes in the second semiconductor structure which in not substantially linearly proportional to the level of current imposed thereon; and halting the imposition of current of increasing levels on the second semiconductor structure when a corresponding current change in the second semiconductor structure which is not substantially linearly proportional to the level of current imposed thereon is noted.

2. The method of claim 1 wherein the step of imposing increasing levels of current on a semiconductor structure comprises imposing each of a series of increasing levels of current on the semiconductor structure.

3. The method of claim 1 wherein the step of imposing increasing levels of current on a semiconductor structure comprises imposing a continuous current of increasing level on the semiconductor structure.

* * * * *